Sept. 11, 1962 J. B. MACKAY 3,053,451

SUPERCONDUCTOR CIRCUITS

Filed Nov. 18, 1958 3 Sheets-Sheet 1

INVENTOR
JAMES B. MACKAY
BY John E. Dougherty, Jr.
ATTORNEY

SUPERCONDUCTOR CIRCUITS

Filed Nov. 18, 1958

United States Patent Office
3,053,451
Patented Sept. 11, 1962

3,053,451

SUPERCONDUCTOR CIRCUITS

James B. Mackay, Poughkeepsie, N.Y., assignor to International Business Machines Corporation, New York, N.Y., a corporation of New York Filed Nov. 18, 1958, Ser. No. 774,667
23 Claims. (Cl. 235—175)

The present invention relates to superconductor circuits and, more particularly, to superconductor circuits such as logical and adder circuits, which produce outputs in accordance with logical combinations of a plurality of individual inputs.

The superconductor circuits heretofore proposed to produce outputs in accordance with logical combinations of a plurality of individual inputs may be divided into two general types. Circuits of the first type employ a plurality of parallel connected superconductor current paths each including one or more cryotron gate conductors which are controlled between superconductive and resistive states my magnetic fields produced by cryotron control conductors arranged adjacent the gate conductors. The inputs are selectively applied to the control conductors so that for each of a number of predetermined combinations of inputs, all but a particular one of the current paths are driven resistive. The circuits of the second type employ a number of individual control conductors for each gate conductor with the control conductors being so arranged that the fields produced thereby either add or subtract in accordance with the direction of current flow in the control conductors. Circuits of both these types have usually demanded a relatively large number of control and gate conductors and the fabrication requirements of the circuits of the second type can be rather critical, especially where the circuits are made in the form of thin films using printed circuit techniques.

In accordance with the principles of the present invention, circuits for producing outputs in response to combinations of inputs are provided wherein the necessary combining of the inputs is achieved by connecting the inputs to produce currents which combine in one or more control conductors. Each of the control conductors is arranged to control the state of a superconductor gate conductor and the magnitude and direction of the inputs applied to each control conductor are such that its gate conductor is driven resistive only for one or more predetermined logical input combinations. Further, in accordance with the principles of the subject invention, the required combinations of input currents in the control conductors are achieved by connecting each control conductor in a closed loop of superconductor material with which a plurality of input current conductors are inductively coupled so that the net current produced in the loop and, therefore, in the control conductor, is a function of both the magnitude and direction of the currents in the input conductors which are coupled to the loop. These principles are advantageously applied in constructing binary full adder circuits which are illustratively disclosed herein and which include both a carry circuit and a sum circuit. The three binary inputs to the adder are applied to both the carry and the sum circuits and, further, in accordance with another aspect of the subject invention, the carry circuit is coupled to the sum circuit so that it too applies an input to the sum circuit. The outputs are produced by the carry circuit in response to combinations of the three binary inputs applied thereto and are produced by the sum circuit in response to combinations of the three binary inputs and the inputs applied by the carry circuit. This arrangement reduces the number of the components necessary to produce the required outputs and also greatly reduces the complexity of the adder circuit.

Therefore, it is a prime object of the present invention to provide novel and improved superconductor circuits.

It is a further object to provide improved superconductor circuits for producing outputs in response to logical combinations of inputs and, more specifically, superconductor full adder circuits.

Still another object is to provide such circuits without the necessity of employing superimposed magnetic fields produced by different control conductors to control the superconductor gating devices in the circuit.

Another object of the invention is to provide superconductor circuits wherein outputs are produced in response to a plurality of independently applied input currents which combine in a single control conductor to control the state of a superconductor gate conductor.

Still another object is to provide circuits employing the combining of currents in a control conductor to produce outputs wherein a single current source may be employed to supply both control currents in a control conductor and current to be controlled in a circuit including a gate conductor which is subjected to magnetic fields produced by current in the control conductor.

Another object of the invention is to provide circuits responsive to combinations of inputs wherein the individual inputs are inductively coupled to a closed superconductive loop which includes a cryotron control conductor and, more specifically, such circuits wherein each of said inputs receives current from the same source as does the cryotron gate conductor which is controlled by the magnetic fields of the control conductor connected in the superconductive loop.

A further object is to provide novel and improved superconductor logical and adder circuits.

Another object is to provide binary adder circuits wherein the carry output of the circuit is utilized in generating the sum output.

A more specific object is to provide an adder circuit including a sum circuit and a carry circuit wherein the carry circuit is responsive to three binary inputs applied to the circuit and the sum circuit is responsive to the combination of these inputs and a further input applied to the sum circuit by the carry circuit.

These and other objects of the invention will be pointed out in the following description and claims and illustrated in the accompanying drawings, which disclose, by way of example, the principle of the invention and the best mode, which has been contemplated, of applying that principle.

Figures 1, 2:
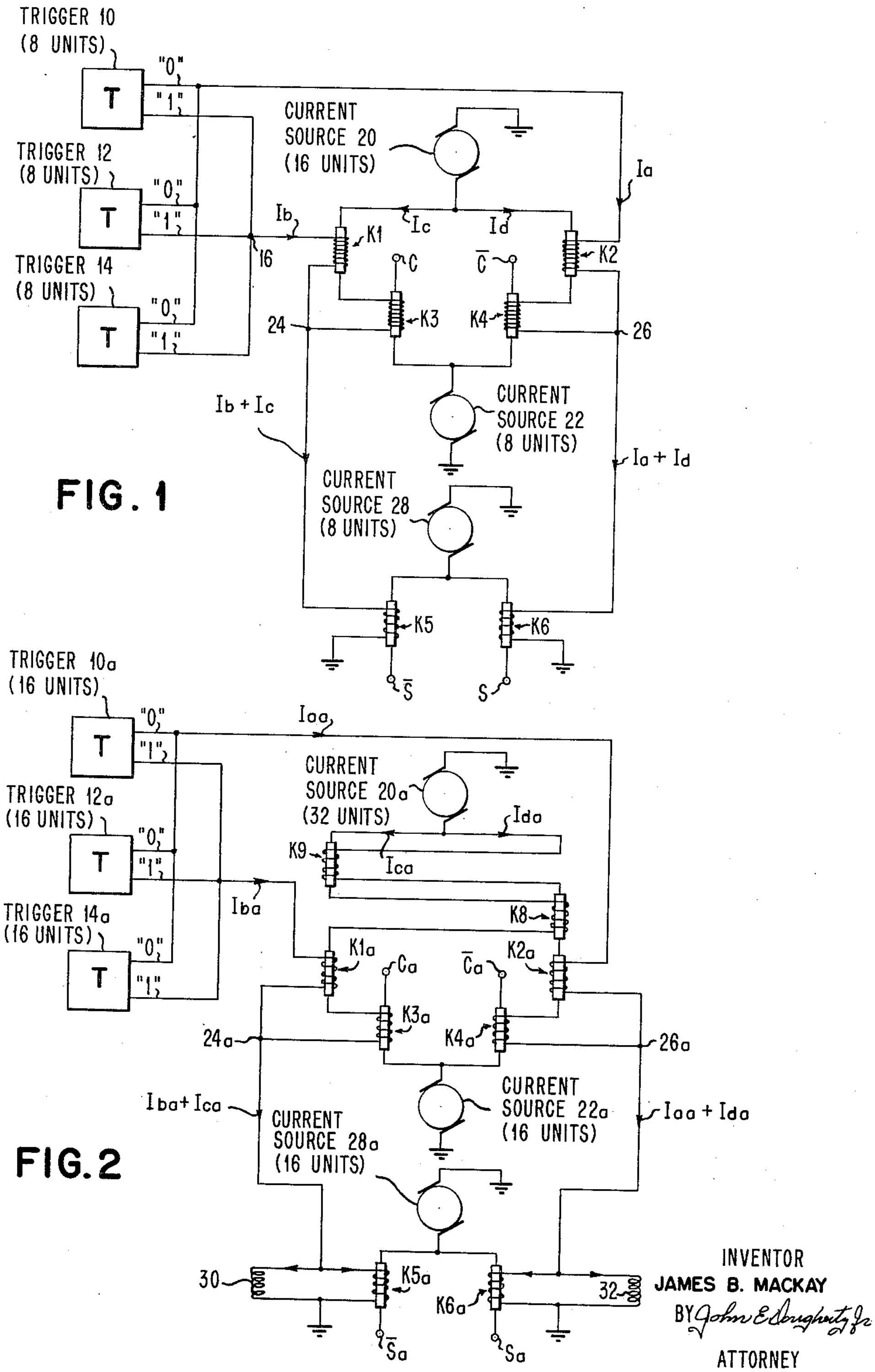
FIGS. 1 and 2 are diagrammatic representations of two different embodiments of binary full adder circuits constructed in accordance with the principles of the invention.
Figures 3, 4:
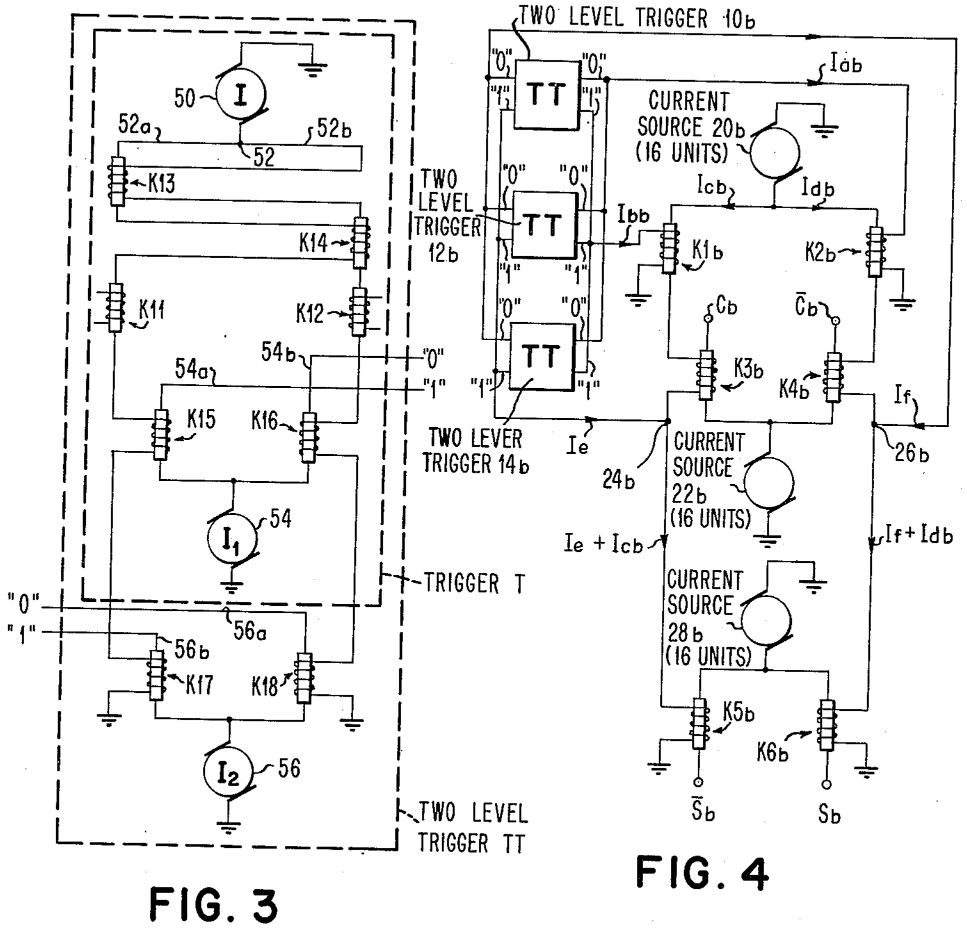
FIG. 3 is a diagrammatic representation of a superconductor trigger circuit.
FIGS. 4 and 5 are further embodiments of binary full adders constructed in accordance with the principles of the invention.

Inputs are applied to the binary full adder circuit of FIG. 1 by three triggers represented by the blocks T and designated 10, 12, and 14. Each of these triggers is provided with two output leads designated "0" and "1." The construction of these triggers is such that each is effective to direct a current to its "1" output lead, when it is to apply a binary input of "one" to the adder, and to direct a current to its "0" output lead when it is to apply a binary input of zero to the adder. The triggers may be cryotron steering or flip flop circuits and one embodiment of the latter type circuit is shown in FIG. 3 of the drawings which will be later described in detail. The three binary "one" output leads of triggers 10, 12, and 14 are connected together at a terminal 16 so that the current from each is applied to the control coil of cryotron K1. The binary zero output leads of these three triggers are similarly coupled together so that the current from each is applied to the control conductor of a cryotron K2. The total current provided by the input trigger circuits 10, 12, and 14 to control conductor K1 is represented as I*b* and that supplied to the control conductor of cryotron K2 as I*a*. The gates of cryotrons K1 and K2 are connected in parallel across a current source 20 to form what may be termed a carry circuit which is bistable. The current from this source which is directed through gate K1 is designated I*c*, and that which is directed through gate K2 is designated I*d*. The current I*c* is also directed through a control conductor of a cryotron K3 and the current I*d* through a control conductor of a cryotron K4. The gates of the cryotrons K3 and K4 are connected in parallel across a current source 22 and direct the current from this source to one or the other of a pair of carry output terminals C and $\overline{C}$ for the adder. This current is directed to the C terminal for a carry output of one and to the $\overline{C}$ terminal for a carry output of zero. The current I*b*, applied by trigger circuits 10, 12, and 14, and the current I*c*, applied by the current source 20, are both directed to a terminal 24 so that a control conductor for a cryotron K5, which is coupled between a superconductive ground and this terminal, carries the sum of these currents, that is *Ib*+*Ic*. Similarly, the currents I*a* and I*d* are both directed to a terminal 26 so that a control conductor for a cryotron K6, which is coupled between this terminal and a superconductive ground, carries the sum of these two currents, that is, *Ia*+*Id*. The gates of cryotrons K5 and K6 are connected in parallel with a current source 28 to form a bistable sum circuit and these gates direct the current from this source to one or the other of a pair of sum output terminals S and $\overline{S}$ for the circuit. The current from source 28 is directed to the sum output terminal S when a sum output of one is required and to the sum output terminal $\overline{S}$ when a sum output of zero is required.

The operation of the circuit in producing the proper carry output at terminals C and $\overline{C}$ in response to inputs applied by the triggers 10, 12, and 14 will be first considered. As is now well known, it is necessary, in order to drive a cryotron gate conductor from a superconductive to a resistive state that there be applied to the control conductor a current sufficient to produce a magnetic field in excess of the critical magnetic field for the gate conductor. This current may be termed a critical or threshold current and, for the control conductors of cryotrons K2, K3, and K4 is here considered to be 10 units of current so that when the current in the control conductor for either of these cryotrons is more than 10 units of current, the cryotron gate is resistive and, when less than 10 units of current, the cryotron gate is superconductive. The design of the binary input triggers circuits 10, 12, and 14 is such that each applies a current of 8 units to one or the other of its output leads "0" and "1" in accordance with the input to be applied to the binary adder circuit. Thus, it can be seen that, when each of the binary input triggers 10, 12, and 14 simultaneously applies a binary input of one, the current I*b* applied to the control conductor of cryotron K1 is equal to 24 units and the gate of this cryotron is driven resistive, whereas the current I*a* applied to the control conductor of cryotron K2 is zero and the gate of this cryotron remains in the superconductive state. Under these conditions, the entire current from source 20 is directed through the gate of cryotron K2 and the control conductor for the cryotron K4 to terminal 26 and there is no current in the gate of cryotron K1 and the control conductor of cryotron K3. Therefore, the gate of cryotron K4 is resistive and that of cryotron K3 is superconductive and the entire current from source 22 is directed to the "one" carry output terminal C as is proper when three binary inputs of "one" are simultaneously applied to the circuit.

The current supplied by the source 20 is equal to 16 units for reasons which will become apparent as the description progresses. The current sources 22 and 28 each supply 8 units of current but the magnitude of current applied by these sources is not critical and they might, for example, each supply more or less current within the limitations of the gain and Silsbee current characteristics of the cryotrons used in these circuits. Cryotrons K5 and K6, which control the production of the sum outputs at terminals S and $\overline{S}$ are designed so that the control coils of these cryotrons require 20 units of current to drive the associated gates resistive. As noted above, the control coil of cryotron K5 carries the current *Ib*+*Ic* and the control coil of the cryotron K6 carries the current *Ia*+*Id*. The table below shows the magnitude of the currents I*a*, I*b*, I*c*, and I*d*, as well as the outputs produced at the terminals S, $\overline{S}$, C and $\overline{C}$ for the four possible current input combinations which can be applied by triggers 10, 12, and 14.

| Number of binary one inputs | *Ia* | *Ib* | *Ic* | *Id* | *Ib* + *Ic* | *Ia* + *Id* | C | $\overline{C}$ | S | $\overline{S}$ |
|---|---|---|---|---|---|---|---|---|---|---|
| 0 | 24 | 0 | 16 | 0 | 16 | 24 | 0 | 8 | 0 | 8 |
| 1 | 16 | 8 | 16 | 0 | 24 | 16 | 0 | 8 | 8 | 0 |
| 2 | 8 | 16 | 0 | 16 | 16 | 24 | 8 | 0 | 0 | 8 |
| 3 | 0 | 24 | 0 | 16 | 24 | 16 | 8 | 0 | 8 | 0 |

From this table, it can be seen where there are less than two binary inputs of "one," the gate of cryotron K1 is superconductive and that of cryotron K2 is held resistive by the current I*a* causing the entire current from source 20 to be directed to the gate of cryotron K1 and the coil of cryotron K3. Under these conditions, cryotron K3 is resistive and cryotron K4 superconductive so that the entire current from source 22 is directed to the $\overline{C}$ output terminal indicative of a carry output of zero. When two or three binary inputs of one are applied, the situation is reversed, that is, the gate of cryotron K2 is superconductive and the gate of cryotron K1 is held resistive by the current I*b* so that the entire current from source 20 is directed to the gate of cryotron K2 and the coil of cryotron K4, thereby maintaining the gate of cryotron K4 resistive. Under these conditions, the entire current from source 22 is directed through the gate of cryotron K3 to the carry output terminal C indicative of a carry output of "one."

The current inputs applied by the triggers 10, 12, and 14 and the current from source 20 are combined at terminals 24 and 26 so that the sum of the currents I*b* and I*c* is applied to the coil of cryotron K5 and the sum of the current I*a* and I*d* is applied to the coil of the cryotron K6. Each of these cryotrons requires a current of 20 units in its control coil to drive the gate resistive. From the table above, it is clear that, when there are either one or three binary inputs applied by triggers 10, 12, and 14, the total current *Ia*+*Id* is insufficient to drive cryotron K6 resistive, while the total current *Ib*+*Ic* is sufficient to drive cryotron K5 resistive. Therefore, under these conditions, as is proper in binary addition, the entire current from source 28 is directed through the superconductive gate of cryotron K6 to the sum output terminal S indicative of a sum output of one. When either none or two of the binary inputs are applied by triggers 10, 12, and 14 are "one," the situation is reversed, cryotron K6 being maintained resistive by the current *Ia*+*Id* and cryotron K5 remaining superconductive so that the entire current from source 28 is directed through the gate of cryotron K5 to the sum output terminal $\overline{S}$ indicative of a sum output of zero.

Therefore, it can be seen that the input currents applied by the input triggers 10, 12, and 14 first perform the function of steering the current from source 20 so that this current controls the production of the carry outputs at terminals C and $\overline{C}$ and, thereafter, the input currents and the current from source 20 are combined at either terminals 24 or 26 to control cryotrons K5 and K6 and, thereby, the production of the sum output at terminals S and $\overline{S}$.

The binary adder circuit of FIG. 2 is similar in many respects to that of FIG. 1 and, for this reason, corresponding current sources, currents and output terminals in FIG. 2 are identified with the same reference characters as are used in FIG. 1 with the letter "*a*" appended. There are, however, a number of differences between the adders of FIGS. 1 and 2, the first being that, in FIG. 2, the cryotrons K8 and K9 have been added to the carry circuit connected to current source 20*a*. These cryotrons are what may be termed cross coupled cryotrons in that each has its gate connected in one side of the parallel circuit extending from source 20*a* and its control conductor connected in the other side of this parallel circuit so that, when the entire current from source 20*a* is directed through either the gate of cryotron K1*a* or the gate of cryotron K2*a*, one or the other of the cross coupled cryotrons K8 or K9 is held resistive. As a result, once the current is established in either of the parallel paths extending from source 20 it is positively maintained in that path. In the circuit of FIG. 1, if the current from source 20 is established in either the path including the gate of cryotron K2 or in the other path which includes the gate of cryotron G1 and the circuit is allowed to become entirely superconductive, the current condition established is maintained. If, however, there is any resistance whatsoever in the path carrying the current, the current will begin to shift. The cross coupled cryotrons K8 and K9 of FIG. 2 ensure against this possibility.

The adder of FIG. 2 also differs from that of FIG. 1 in the magnitudes of the currents supplied by the various current sources. In the adder of FIG. 2 input triggers 10*a*, 12*a*, and 14*a* and sources 22*a* and 28*a* each supply 16 units of current and source 20*a* supplies 32 units of current. Another difference between the two adders is that each of cryotrons in the embodiment of FIG. 2 twenty units of current in its control conductor to drive the gate conductor resistive. This feature whereby the circuit may be designed exclusively with cryotrons having the same characteristics is achieved by connecting a pair of shunting coils designated 30 and 32 in parallel with the control coils for cryotron K5*a* and K6*a*, respectively. These additional coils are designed to have the same inductance as coils K5*a* and K6*a*, and each of these coils is maintained in superconductive states so that the current applied to the parallel combination of coil 30 and the coil of cryotron K5*a*, and similarly, the current applied to the combination of coil 32 and the coil of cryotron K6*a*, divides equally between these coils. Thus, though triggers 10*a*, 12*a*, and 14*a* each supply a current in magnitude equal to 16 units at one or the other of the terminals 24*a* and 26*a*, only half of this current, that is 8 units, is supplied to the coil of cryotrons K5*a* or K6*a* as the case may be. Similarly, though source 20*a* supplies 32 units of current to either terminal 24*a* or 26*a* according to the inputs applied, only one half of this current is applied to the control conductor of one of the cryotrons K5*a* or K6*a*.

Thus, it becomes apparent that the magnitudes, other than zero, of the currents I*aa* and I*ba* which are applied to the control coils of cryotrons K1*a* and K2*a* in the circuit of FIG. 2 are twice those which are applied to the coils of cryotrons K1 and K2 in FIG. 1. However, since cryotrons K1*a* and K2*a* require 20 units of current for their gates to be driven resistive, the operation is the same with the current I*aa* being sufficient to drive the gate of cryotron K2*a* resistive when one or no binary inputs of one are applied and the current I*ba* being sufficient to drive the gate of cryotron K1*a* resistive when two or three binary inputs of "one" are applied. Similarly, the total currents $Iaa+Ida$ and $Iba+Ica$ in the circuit of FIG. 2 are twice the magnitude of their counterparts $Ia+Id$ and $Ic+Ia$ in the adder of FIG. 1. However, the parallel or shunt coils 30 and 32 shunt half of these currents out of coils K5*a* and K6*a* so that, for each combination of inputs, the magnitude of the currents in the control coils K5*a* and K6*a* in FIG. 2 is the same as that in coils K5 and K6 in FIG. 1 and, therefore, sum outputs are produced at terminal $\overline{S}a$ and S*a* of FIG. 2 in accordance with the rules of binary addition.

FIG. 3 shows a trigger circuit which might be used to apply inputs to the binary adder circuits of FIGS. 1 and 2 as well as what is termed a two level trigger that is employed in the binary adder of FIG. 4 which is to be described later in this specification. The portion of the circuit of FIG. 3 which is enclosed within the dotted block identified as trigger T is a conventional cross coupled cryotron trigger circuit. This circuit includes a current source 50 connected to a terminal 52 from which extend two parallel paths 52*a* and 52*b*. The trigger circuit T includes six cryotrons designated K11 through K16. Cryotrons K11 and K12 are input cryotrons and have their gates connected in paths 52*a* and 52*b*, respectively; cryotrons K13 and K14 are cross coupled cryotrons each having its gate connected in one of the parallel paths and its control coil in the other; cryotrons K15 and K16 are output cryotrons and have their control conductors connected in paths 52*a* and 52*b*, respectively. The trigger is set in its one stable state by energizing the control coil of cryotron K11 to thereby drive the gate of this cryotron resistive and cause the entire current from source 50 to be directed through path 52*b*. The trigger may be similarly set to a zero state, in which the entire current from source 50 is in path 52*a*, by energizing the control coil of cryotron K12. The output current for the circuit is provided by a current source 54, with which the gates of cryotrons K15 and K16 are connected in parallel. When the trigger is in its "one" state, the gate of cryotron K16 is held resistive so that the current source 54 is directed through the gate of cryotron K15 to a conductor 54*a* which serves as a "1" output conductor for the trigger. When the trigger is in its zero state, the current from source 54 is directed through the then superconductive gate of cryotron K16 to a conductor 54*b* which is the "0" output lead for the trigger.

Figure 3A:
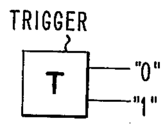
FIGS. 3A and 3B show block diagram representations which are employed to represent portions of the circuit of FIG. 3 in the embodiments shown in the other drawings.

FIG. 3A shows the block diagram representation of the trigger of FIG. 3 which is employed in illustrating the adder circuits of FIGS. 1 and 2. The trigger supplies current to either its "1" or "0" output lead according to the state that it is in. The output current is supplied by source 54 in FIG. 3 and, for the embodiment of FIG. 1, this output current source for the triggers would be designed to supply 8 units of current; whereas, for the embodiment of FIG. 2, source 54 would be designed to supply 16 current units.

Figure 3B:
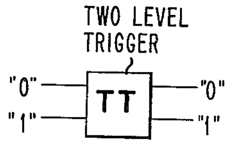

The trigger circuit of FIG. 3 includes, below the portion of the circuit enclosed by block T, a second output circuit which includes a current source 56 and a pair of cryotrons K17 and K18. The coils of cryotrons K17 and K18 are connected in paths 52*a* and 52*b*, respectively, and the gates of these cryotrons are connected in parallel across source 56. When the trigger circuit is in its binary "one" state, that is with the current from source 50 in path 52*b*, the gate of cryotron K18 is resistive and that of cryotron K17 is superconductive so that the current from source 56 is directed through the latter gate to a conductor 56*b* which is a second "1" output conductor for the trigger circuit. Similarly, when the trigger is in its binary zero state, the current from source 56 is directed through the then superconductive gate of cryotron K18 to a second zero output conductor 56*a* for the circuit. Thus, it may be seen that the trigger circuit of FIG. 3 supplies two separate "0" and "1" outputs and that the magnitude of these outputs may be different since, of course, the magnitudes of the currents supplied by sources 54 and 56 may differ. The circuit may, thus, be appropriately termed a two level trigger and, in the full adder circuit of FIG. 4, this circuit is used to apply binary inputs. This two level trigger designated TT in FIG. 3 is shown in block diagram form in FIG. 3B with the first pair of "0" and "1" output leads, which receive their current from source 54 extending to the right, and the second pair which receive their current from source 56 extending to the left. The two level trigger circuits TT used in the full adder of FIG. 4 are designed so that the magnitude of the current supplied to the "0" and "1" leads which extend to the right is 16 units and the magnitude of the circuit supplied to the "0" and "1" output leads which extend to the left is 8 units.

Since the circuit of FIG. 4 is similar in many respects to that of FIGS. 1 and 2, the reference characteristics employed in FIG. 4 correspond to those used to identify similar components in FIG. 1 with the exception that, in FIG. 4, the letter "*b*" has been appended to the reference characteristics.

Each of the cryotrons in FIG. 4 is designed so that a current of 20 units is required in the control conductor to drive the gate conductor resistive. The portion of the adder circuit of FIG. 4 which produces the carry output at a pair of output terminals $\overline{C}b$ and C*b* is similar to that of FIG. 1 in that no cross coupled cryotrons are provided. A current source **20*b*** supplies sixteen units of current to the parallel connected gates of a pair of cryotrons K1*b* and K2*b*. These gates are controlled between superconductive and resistive states by the currents I*bb* and I*ab* which currents are supplied by the input triggers **10*b*, 12*b*, and 14*b***. Each of these triggers supplies 16 units of current to one or the other of the pair of "0" and "1" outputs which extend to its right. Thus, according to the inputs applied, the currents I*bb* and I*ab* may be either 0, 16, 32, or 48 units, with the sum of the two currents always being equal to 48 units. Since each of the control coils of cryotrons K1*b* and K2*b* require 20 units of current to drive the associated gate resistive, it becomes apparent that, when there are less than two binary inputs of one, the gate of cryotron K2*b* is resistive and, thus, the current from source **20*b*** is directed through the gate of cryotron K1*b* and the coil of cryotron K3*b*. The gate of cryotron K3*b* is, therefore, driven resistive causing the current from source **22*b*** to be directed to the zero carry output terminal $\overline{C}b$. When two or three binary inputs of one are applied, the situation is reversed, the gates of cryotrons K1*b* and K4*b* being driven resistive causing an output to be manifested at the "one" carry output terminal C*b*.

The adder circuit of FIG. 4 differs from the adders of FIGS. 1 and 2 in that the currents I*ab* and I*bb* are not combined with the currents I*cb* and I*db*, that is the portions of the current from source **20*b*** which are directed through gates K1*b* and K3*b*, respectively. Instead, the other output leads of the two level triggers **10*b*, 12*b*, and 14*b*, that is the leads extending to the left of these triggers, are connected to the terminals 24*b* and 26*b* so that these currents are there combined. The binary one output leads of these three triggers are connected to terminal 24*b*** and the total current which the triggers supply at this terminal is designated I*e*. This current has a magnitude of 0, 8, 16, or 24 units of current according to whether the number of binary "one" inputs is zero, one, two, three, or four. The current I*e* combines with current I*cb* at terminal **24*b*** so that the control coil of cryotron K5*b* carries the sum of these currents, that is $Ie+Icb$. Since the source **20*b* supplies 16 units of current, and the triggers 10*b*, 12*b*, and 14*b* each supply 8 units of current to the output leads connected to terminals 24*b* and 26*b***, the total current in control coil K5*b* for each of the four different possible combinations of inputs corresponds to that in the control coil of K5 in the circuit of FIG. 1; that is, the total current $Ie+Icb$ in the circuit of FIG. 4 corresponds exactly to the value for the current $Ib+Ic$ in the circuit of FIG. 1 for each combination of inputs. Similarly, the sum of the current I*db* with a current, if supplied by the zero output leads to terminal **26*b* of FIG. 4 corresponds to the value of the current $Ia+Id$ in the embodiment of FIG. 1. Therefore, when there are either one or three binary inputs of one applied by triggers 10*b*, 12*b*, and 14*b***, the sum of the currents $Ie+Icb$ equals 24 units and the current $If+Idb$ equals 16 units. The gate of cryotron K5*b* is then driven resistive and the current from a source **28*b*** is directed through the superconductive gate of cryotron K6*b* to the "one" sum output terminal S*b*. When the number of binary inputs applied is either zero or two, this current distribution is reversed so that the gate of cryotron K6*b* is driven resistive and an output is manifested at the zero sum output terminal $\overline{S}b$.

Figure 5:
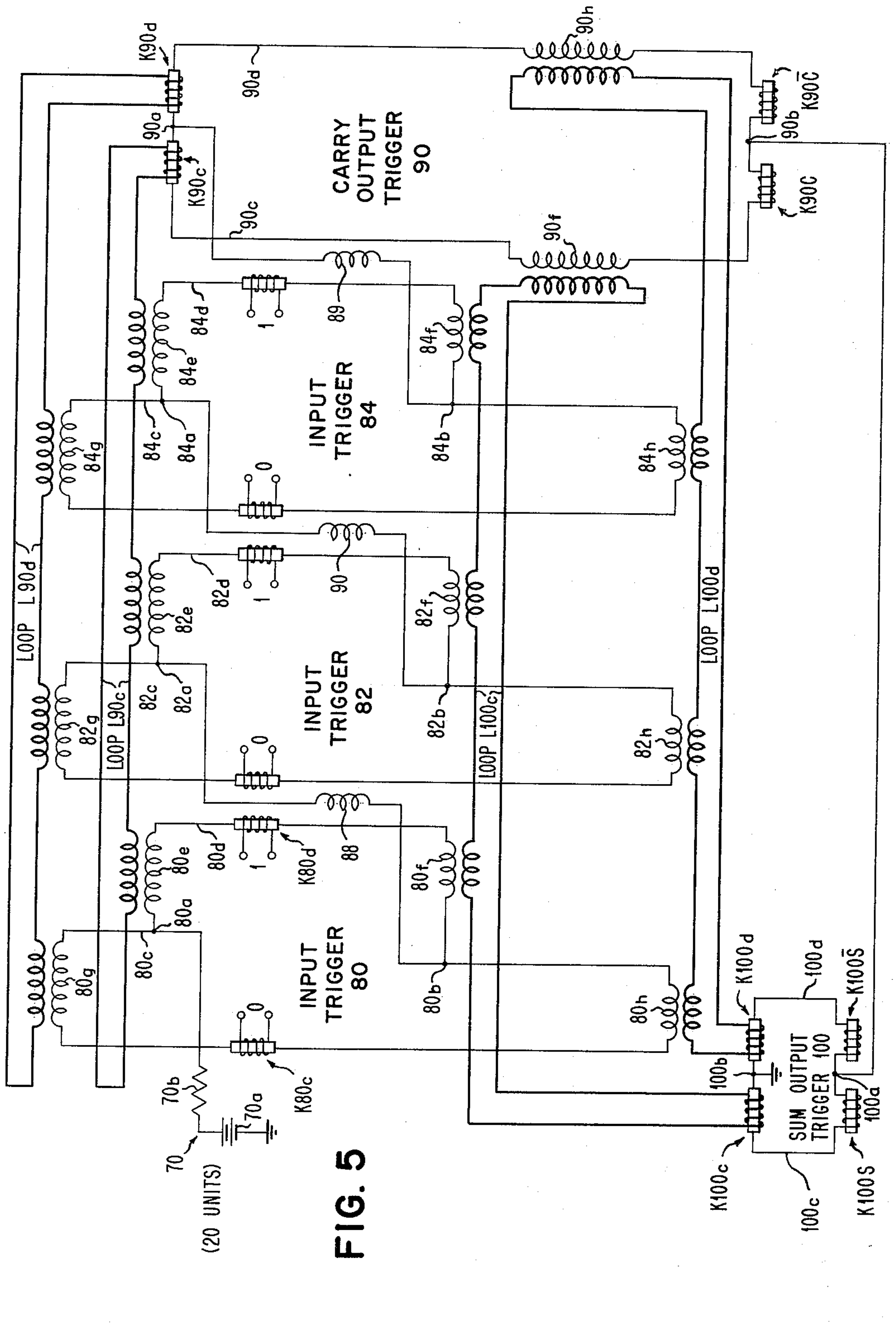

The embodiment of the binary full adder shown in FIG. 5 is similar to the previously discussed embodiments in that three input triggers are employed to provide currents which add in one or the other of two cryotron control windings to drive an associated gate resistive and thereby control a current which produces a carry output, with the current thus controlled being then combined with the input currents supplied by the input triggers in one or the other of two further cryotron control windings to thereby control the production of the sum output for the adder. However, the embodiment of this figure differs from the other embodiments in that only a single current source is required. This source is represented by a battery **70*a* and resistor 70*b*, the source being generally designated 70**.

Source 70 supplies a current of 20 units in series to each of the input triggers 80, 82, and 84, which apply binary one and zero inputs to the adder, and also to carry output trigger 90 and a sum output trigger 100. Source 70 is connected to a supply current input terminal **80*a* for input trigger 80 and from this terminal the current is directed through one or the other of two parallel paths 80*c* and 80*d* to a supply current output terminal 80*b* for this trigger. Path 80*c*** includes the gate of a cryotron K80*c* and path **80*d*** includes the gate of a cryotron K80*d*. The coils of these cryotrons are selectively energized to set the trigger in either a binary one or a binary zero state. When the coil of cryotron K80*c* is energized to drive the gate of this cryotron resistive, the current from source 70 is directed through the path **80*d*** and the trigger is in its binary zero state. Conversely, when the coil of cryotron K80*d* is energized to drive the gate of this cryotron resistive, the trigger is set in its binary one state with the current from source 70 in path **80*c*. The supply current output terminal 80*d* of trigger 80 is connected through a decoupling inductance 88 to a supply current input terminal 82*a* for trigger 82. This trigger is of the same construction as trigger 80 so that the supply current is directed through a path 82*d* to a terminal 82*b*, when the trigger is set in a binary zero state, and through a path 82*c* to terminal 82*b*, when the trigger is set in a binary one state. Terminal 82*b* is connected through a decoupling inductance 90 to a supply current input terminal 84*a* for input trigger 84. The current is then directed either through a binary one path 84*c* or a binary zero path 84*d* to a supply current output terminal 84*b* for this trigger. The triggers 80, 82 and 84**, as well as the other triggers shown in FIG. 5 may include cross coupled cryotrons similar to those shown in FIGS. 2 and 3.

After passing through the three binary input triggers 80, 82, and 84, the current from source 70 is directed from terminal **84*b* through decoupling inductance 89 to an input terminal 90*a* for a carry output trigger 90**.

The current is directed from this terminal through either path 90*c* or 90*d*, in accordance with the state of the gates of a pair of cryotrons K90*c* and K90*d*, to a source current output terminal 90*b* for the carry output trigger 90. The gates of cryotrons K90*c* and K90*d* control the state of trigger 90 and the control coils for these gates receive their current under the control of the binary input triggers in a manner which will be explained in detail below. It suffices for the present to point out that, when a carry output of "one" is required, the gate of cryotron K90*d* is resistive and that of cryotron K90*c* is superconductive so that the source current is directed through path 90*c* to terminal 90*b*. This path includes the control coil for a cryotron K90C and a carry output of one is manifested when the gate of this cryotron is held resistive by current in path 90*c*. Similarly, when a carry output of zero is required the gate of cryotron K90*d* is superconductive so that the source current is directed through path 90*d* to terminal 90*b*. Path 90*d* includes the control coil of a cryotron K90$\overline{\text{C}}$ and, when the gate of this cryotron is maintained resistive by a current in this path, a carry output of zero is indicated. Thus, it can be seen that when the gate of cryotron K90*c* is resistive and that of cryotron K90*d* is superconductive, a carry output of zero is manifested and, when the gate of cryotron K90*c* is superconductive and that of cryotron K90*d* is resistive, a carry output of "one" is manifested.

The sum output for the adder is produced by a sum output trigger 100 which has a source current input terminal 100*a* connected to terminal 90*b* of the carry output trigger 90. The current is directed from this terminal either through a path 100*c* which includes the coil of a cryotron K100S and the gate of a cryotron K100*c*, to a grounded source current output terminal 100*b* for the trigger, or through a path K100*d*, which includes a coil of a cryotron K100$\overline{\text{S}}$ and a gate of a cryotron K100*d*. Cryotrons K100S and K100$\overline{\text{S}}$ are the sum output cryotrons for the adder. A sum output of "one" is indicated when the gate of cryotron K100S is resistive and a sum output of zero is indicated when the gate of cryotron K100$\overline{\text{S}}$ is resistive. The current distribution in the sum output trigger 100, and therefore, the production of the sum output is controlled by the state of cryotrons K100*c* and K100*d*. When the current in the control coils of these cryotrons is such that the gate of cryotron K100*d* is resistive and that of cryotron K100*c* is superconductive, a sum output of one is produced. When the state of cryotrons K100*c* and K100*d* is reversed, a sum output of zero is indicated.

The manner in which the binary input triggers 80, 82, and 84 control the application of current to the control coils of cryotrons K90*c* and K90*d*, and K100*c* and K100*d*, which cryotrons in turn control the carry and sum output triggers, will now be explained.

The control coil for each of these cryotrons is connected in a corresponding one of four closed current loops designated L90*c*, L90*d*, L100*c* and L100*d*. These loops are shown with heavy lines in the drawing to present a more graphic illustration. Each of these loops is fabricated entirely of material which remains superconductive when the inputs are applied and the sum and carry outputs produced in response to these inputs. Each of the binary input triggers includes, in one of its parallel current carrying paths, conductor segments which are inductively coupled with loops L90*c* and L100*c* and in the other of its parallel paths, conductor segments which are inductively coupled to loops L90*d* and L100*d*. Input trigger 80, for example, includes in the path 80*d*, which carries current when the trigger is in the binary zero state, a coil 80*e* which is inductively coupled to loop L90*c* and a coil 80*f* which is inductively coupled to loop L100*c*. Similarly, the other or binary one current path 80*c* of this trigger includes a pair of coils 80*g* and 80*h* which are inductively coupled to loops L90*d* and L100*d*, respectively. Similarly, each of the other binary input triggers 82 and 84 includes, in its binary one current path, one coil coupled to loop L90*d* and one coil inductively coupled to loop L100*d*, and also, in its binary zero path, one coil inductively coupled to loop L90*c* and a second coil inductively coupled to loop L100*c*. The carry output trigger also includes a pair of coils, one in path 90*c* which is designated 90*f* and is inductively coupled to loop L100*c* and, the other which is designated 90*h* is inductively coupled to loop L100*d*.

It is through this inductive coupling of the binary current carrying conductors of the input triggers 80, 82, and 84 and the carry trigger 90 that currents are selectively applied to the control coils of cryotrons K90*c*, K90*d*, K100*c* and K100*d* to control the production of the sum and carry outputs for the circuits. Each of the loops L90*c*, L90*d*, L100*c*, and L100*d* is, as noted above, entirely superconductive and it is characteristic of a superconductive loop that it is not possible to change the net magnetic flux threading such a loop while it remains entirely superconductive. Therefore, such loops may be employed as secondary circuits in what may be termed direct current transformers. For example, if trigger 80 is set in its zero state so that the current from source 70 is directed through path 80*d*, which includes coils 80*e* and 80*f*, this current produces a flux which threads loops L90*c* and L100*c*. This flux produces in each of these loops a current having a magnitude and direction such that the net flux threading that loop remains unchanged at either zero or whatever value it had when the loops became entirely superconductive. It should be emphasized that the condition exists when the current in path 80*d* is stable at the level of 20 units supplied by source 70.

Let us assume that each of the loops L90*c*, L90*d*, L100*c*, and L100*d* is initially in a condition with essentially no flux threading it and, therefore, no persistent current circulating in the loop. If, thereafter, current is supplied by source 70 with, for example, each of the input triggers set to carry current in its zero current carrying path, that is in paths 80*d*, 82*d*, and 84*d*, then the source current flows in coils 80*e*, 82*e*, and 84*e*, which are inductively coupled to loop L90*c*, and in coils 80*f*, 82*f*, and 84*f*, which are inductively coupled to loop L100*c*. The coupling between coils 80*e*, 82*e*, and 84*e* and loop L90*c* and the inductance of the loops are such that the 20 units of current supplied to any one of these coils by source 70 produces a current of 6 units in loop L90*c*. Similarly, 20 units of current in any one of the coils 80*g*, 82*g*, and 84*g* produces a current of 6 units of current in loop L90*d*. Therefore, when each of the three coils 80*e*, 82*e*, and 84*e* is carrying 20 units of current, the current in loop L90*c*, which includes the control coil of cryotron K90*c*, is equal to 18 units. This cryotron and all of the other cryotrons in this adder circuit are designed to require 10 units of control current to drive their gates resistive, and the gate of cryotron K90*c* is, therefore, maintained resistive. Under the above described conditions, that is with three inputs of zero applied by the input triggers, none of the coils 80*g*, 82*g*, and 84*g*, which link loop L90*d* is carrying current. Thus, there is no current induced in loop L90*d* and no current in the coil of cryotron K90*d* so that the gate of cryotron K90*d* is superconductive. The supply current of 20 units is directed through path 90*d* of the carry output trigger causing the gate of cryotron K90$\overline{\text{C}}$ to be maintained resistive to manifest a carry output of zero.

The sum output is produced under the control of currents induced in loops L100*c* and L100*d*. Under the above described input conditions, coils 80*f*, 82*f*, and 84*f*, which are coupled to loop L100*c*, are each carrying 20 units of current and there is no current in the coils 80*h*, 82*h*, and 84*h*, which are linked to loop L100*d*. Further, the 20 units of current in path 90*d* of the carry output trigger 90 passes through coil 90*h*, which is coupled to loop L100*d*, and there is no current in the path 90*c* that includes coil 90*f* which is coupled to loop L100*d*. The coupling between coils 80*f*, 82*f*, 84*f*, and loop L100*c* and the inductance of this loop is such that a current of 20 units in any one of these coils produces a current of 4 units in loop L100*c*. Similarly, each of the coils 80*h*, 82*h*, and 84*h* is effective, when carrying 20 units of current, to induct a current of 4 units in the loop L100*d*; coil 90*f* in the carry control trigger 90 is effective, when carrying 20 units of current, to produce a current of 8 units in loop L100*c*; and coil 90*h* is effective, when carrying 20 units of current, to produce a current of 8 units in loop L100*d*. Thus, with three inputs of zero applied by the input triggers, the currents in coils 80*f*, 82*f*, and 84*f* produce a current of 12 units in loop L100*c* which includes the coil of cryotron K100*c*, and the current in coil 90*h* produces a current of 8 units in loop L100*d* which includes the control coil of cryotron K100*d*. Therefore, the gate of cryotron K100*d* is superconductive and that of cryotron K100*c* resistive so that the current is directed through path 100*d* of the sum output trigger to drive the gate of cryotron K100$\overline{S}$ resistive and thereby manifest a sum output of zero.

From the above it can be seen that the binary input triggers control the production of current in loops L90*c* and L90*d* and that the total current in each of these loops determines the state of the carry output trigger 90. Similarly, the currents in the binary input triggers induce currents in loops L100*c* and L100*d* and these currents are combined in one of these loops with a current produced by the 20 units of current flowing in either coil 90*f* or 90*h* of the carry output trigger. There is shown below a table depicting the current in the various loops and control coils for the four possible binary one and zero input combinations for the adder. It should be kept in mind in examining this table that, when the current in the coil of cryotron K90*c* exceeds 10 units the carry output trigger 90 is in its zero state; when the current in control coil of cryotron K90*d* exceeds 10 units, the carry output trigger is in its one state; when the current in the coil of cryotron K100*c* exceeds 10 units, the sum output trigger is in its zero state; and when the current in the coil of cryotron K100*d* exceeds 10 units, the sum output trigger is in its one state.

| Number of binary one inputs | Loop L90c and coil of cryotron K90c | Loop L90*d* and coil of cryotron K90*d* | Loop L100c and coil of cryotron K100c | Loop L100*d* and coil of cryotron K100*d* |
|---|---|---|---|---|
| 0 | 18 | 0 | 12 | 8 |
| 1 | 12 | 6 | 8 | 12 |
| 2 | 6 | 12 | 12 | 8 |
| 3 | 0 | 18 | 8 | 12 |

Each of the above described embodiments is illustratively disclosed in wire form, and, specifically, with wire wound cryotrons as the switching elements. These wire wound cryotrons may, for example, be fabricated of tantalum gates and niobium control coils, in which case the operating temperature of the circuit might be 4.2° K. Combinations of lead control coils and tin gates might also be utilized, in which case the operating temperature would be in the neighborhood of 3.7° K. For each of the above combinations, the cryotron control coils are capable of remaining superconductive in the presence of the fields which they produce to drive their associated gates resistive. The adder circuits herein disclosed, as well as the other circuits within the scope of the invention, may also be fabricated in planar form using printed circuit type techniques. In circuits of this type the cryotrons may be fabricated in the planar form shown and described in copending application, Serial No. 625,512, filed on November 30, 1956, in behalf of R. L. Garwin and assigned to the assignee of this application.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention, therefore, to be limited only as indicated by the scope of the following claims.

What is claimed is:

1. In a binary full adder; a carry circuit including first and second superconductor paths connected in parallel with a current source; a sum circuit including third and fourth superconductor paths connected in parallel with a current source; each of said paths being maintained at a temperature at which it is superconductive in the absence of a magnetic field; first, second, third, and fourth control conductors arranged in magnetic field applying relationship to said first, second, third, and fourth superconductor paths for selectively introducing resistance into said paths; first, second, and third binary input means for said adder coupled to each of said first, second, third, and fourth control conductors; each of said binary input means being individually effective, when it applies an input of one to said adder, to produce a current in said first and third control conductors and, when it applies an input of zero to said adder, to produce a current in said second and fourth control conductors; said currents individually produced by said first, second, and third binary input means combining in each of said control conductors whereby the current produced by said binary input means in each of said control conductors varies in accordance with the number of binary one and binary zero inputs applied by said binary input means; said third and fourth control conductors being coupled, respectively, to said first and second paths of said carry circuit whereby current in said first path of said carry circuit produces a current in said third control conductor which combines with current produced in said third control conductor by said binary inputs and current in said second path of said carry circuit produces a current in said fourth control conductor which combines with current produced in said third control conductor by said binary inputs.

2. The adder of claim 1 wherein the current produced in said third and fourth control conductors by said current in said first and second paths, respectively, is double the current produced in these control conductors individually by any one of said first, second, and third control conductor means.

3. In a superconductor binary full adder; a carry circuit including first and second superconductor paths connected in parallel with a current source; a sum circuit including third and fourth superconductor paths connected in parallel with a current source; each of said paths being maintained at a temperature at which it is superconductive in the absence of a magnetic field; first, second, and third binary input means for said adder; first means coupled to said first, second, and third binary input means and responsive thereto for controlling said first and second paths of said carry circuit between superconductive and resistive states in accordance with the inputs applied to said adder by said first, second, and third binary input means; said first means being effective when the number of binary one inputs applied to said adder is either zero or one to drive said second path resistive and cause current to be directed in said carry circuit through said first path and, when the number of binary one inputs applied to said adder is either two or three to drive said first path resistive and cause current to be directed in said carry circuit through said second path; and third and fourth control conductors arranged in magnetic field applying relationship to said third and fourth superconductor paths of said sum circuit; said first, second, and third binary inputs being coupled to said third and fourth control conductors for producing a current in said third control conductor for each binary input of one applied to said adder and a current in said fourth control conductor for each binary input of zero applied to said adder; said third and fourth control conductors being respectively coupled to said first and second paths in said first circuit for producing a current in said third control conductor when the current in said first circuit is in said first path and a current in said fourth control conductor when the current in said first circuit is in said second path; said currents produced in said third and fourth control conductors by each of said binary inputs respectively combining with said currents produced in said third and fourth conductors by said currents in said first and second paths in said carry circuit; whereby the combined current produced in said third control conductor is effective to drive said third gating device resistive when the number of binary one inputs applied to said circuit is either one or three and the combined current produced in said fourth control conductor is effective to drive said fourth gating device resistive when the number of binary one inputs applied to said circuit is either zero or two.

4. In a superconductor binary full adder; a carry circuit including first and second superconductor paths connected in parallel with a current source; a sum circuit including third and fourth superconductor paths connected in parallel with a current source; each of said paths being maintained at a temperature at which it is superconductive in the absence of a magnetic field; first, second, and third binary input means for said adder; first means coupled to said first, second, and third binary input means and responsive thereto for applying magnetic fields to said first and second paths of said carry circuit; said magnetic fields being effective, when two or three of said binary input means apply binary inputs of one to introduce resistance into said first path only and, when two or three of said binary input means apply inputs of zero, to introduce resistance into said second path only; whereby current from said source with which said first and second paths are connected in parallel is directed through said first path when two or three of said binary input means apply binary inputs of zero and through said second path when two or three of said binary input means apply binary inputs of one; second means coupled to said first, second and third binary input means and to said first path of said carry circuit and responsive to inputs applied by said binary input means and to current in said first path of said carry circuit for applying to said third path of said sum circuit magnetic fields effective to introduce resistance into this path when one only or all three of said binary input means apply binary inputs of one to said adder, and third means coupled to said first, second, and third binary input means and to said second path of said carry circuit and responsive to inputs applied by said binary input means and to current in said second path of said carry circuit for applying to said fourth path of said sum circuit magnetic fields effective to introduce resistance into this path when one only or all three of said binary input means apply binary inputs of zero to said adder.

5. The adder of claim 4 wherein said first means is inductively coupled to each of said first, second, and third binary input means; said second means is inductively coupled to each of said first, second, and third binary input means and to said first path in said carry circuit; and said second means is inductively coupled to each of said first, second, and third binary input means and to said second path in said carry circuit.

6. The adder of claim 4 wherein said first means is electroconductively coupled to each of said first, second, and third binary input means; said second means is electroconductively coupled to each of said first, second, and third binary input means and to said first path in said carry circuit; and said second means is electroconductively coupled to each of said first, second, and third binary input means and to said second path in said carry circuit.

7. A binary full adder comprising; a carry circuit including first and second superconductor current paths connected in parallel with a current input terminal; a sum circuit including third and fourth superconductor current paths connected in parallel with a current input terminal; each of said paths being maintained at a temperature at which it is superconductive in the absence of a magnetic field; first, second, and third binary input means for applying inputs to said adder; each of said first, second, and third binary input means including a binary one current path in which current flows when that input means applies a binary input of one to said adder and a binary zero current path in which current flows when that input means applies a binary input of zero to said adder; first, second, third, and fourth control conductors arranged in magnetic field applying relationship to said first, second, third, and fourth paths, respectively, and means coupling each of said binary one current paths to said first and third control conductors and each of said binary zero current paths to said second and fourth control conductors and coupling said first path of said carry circuit to said third control conductor and said second path of said carry circuit to said fourth control conductor.

8. A superconductor logical circuit comprising first and second superconductor circuits for producing outputs in accordance with different predetermined combinations of inputs applied to said logical circuit; each of said first and second circuits including first and second superconductor paths connected in parallel with a current input terminal for that circuit; each of said paths being maintained at a temperature at which it is superconductive in the absence of a magnetic field; a plurality of inputs for said circuit each including a binary one input conductor and a binary zero input conductor; first and second control conductors arranged in magnetic field applying relationship to said first and second paths, respectively, of said first circuit; third and fourth control conductors arranged in magnetic field applying relationship to said first and second paths, respectively, of said second circuit; and means coupling each of said binary one input conductors to said first and third control conductors and each of said binary zero input conductors to said second and fourth control conductors and coupling each of said first and second paths of said first circuit to a corresponding one of said third and fourth control conductors.

9. In a binary full adder; a first superconductor circuit including first and second superconductor current paths connected in parallel with respect to a current source; a first superconductor gating device connected in said first path; a second superconductor gating device connected in said second path; each of said gating devices being maintained at a temperature at which it is superconductive in the absence of a magnetic field; first and second control conductors arranged in magnetic field applying relationship to said first and second superconductor gating devices, respectively; first, second, and third pairs of binary inputs for said circuit each including a binary one input conductor and a binary zero input conductor; means for applying a particular value of current to the binary zero input conductor for each input when that input is to apply a binary zero input to said adder and to the binary one input conductor when that input is to apply a binary one input to said adder; means coupling the binary one input conductor for each of said inputs to said first control conductor for producing in said first control conductor a current proportional to a combination of the currents in the three binary one input conductors; and means coupling the binary zero input conductor for each of said inputs to said second control conductor for producing in said second control conductor a current proportional to a combination of the currents in the three binary zero input conductors.

10. In a superconductor circuit; a gate conductor of superconductor material maintained at a temperature at which it is superconductive in the absence of a magnetic field; a closed loop of superconductor material maintained at a temperature at which it is superconductive; said loop including a control conductor arranged in magnetic field applying relationship to said gate conductor; said control conductor being effective when the current in said loop is greater than a predetermined minimum to drive said gate conductor from a superconductive to a resistive state; a plurality of inputs for said circuit for producing current in said loop and thereby controlling said gate between superconductive and resistive states; each of said inputs including an input conductor inductively coupled to said loop; a plurality of control means one for each of said inputs for controlling that input by causing a current to flow in the input conductor thereof; a current in any one of said input conductors producing a magnetic field through said loop inductively coupled thereto and thereby producing a current in said loop; the currents produced in said loop by current in each of said input conductors combining in said loop whereby the net current in said loop and in the control conductor connected therein is greater or less than said predetermined minimum in accordance with the inputs applied to said circuit.

11. The circuit of claim 10 wherein the current produced in said loop by a current in one of said input conductors is greater than the current produced in said loop by a current of the same magnitude in another one of said input conductors.

12. The circuit of claim 10 wherein the currents produced in said loop by said input conductors are all in the same direction and current in any one of said input conductors alone is ineffective to produce in said circuit a current greater than said predetermined minimum.

13. The circuit of claim 10 wherein said circuit is a sum circuit for a binary full adder and said plurality of inputs for the sum circuit include first, second, and third binary inputs for said adder and a carry circuit for said adder.

14. In a superconductor circuit; a superconductor gate conductor; a closed superconductor loop; a superconductor control conductor connected in said loop and arranged in magnetic field applying relationship to said gate conductor; said gate conductor and said loop including said control conductor each being maintained at a superconductive temperature; a plurality of inputs for said circuit each including a current path inductively coupled to said loop whereby a current in any one of said paths produces a current in said loop; a single current source coupled to each of said paths for supplying current to each of said paths; control means for controlling the application of inputs to said circuit by causing current from said source to be selectively directed through one or more of said paths; whereby the net current in said loop varies in accordance with the inputs applied to said circuit.

15. In a superconductor circuit; a superconductor gate conductor; a closed superconductor loop; a superconductor control conductor connected in said loop and arranged in magnetic field applying relationship to said gate conductor; said gate conductor and said loop including said control conductor being maintained at a superconductive temperature; a plurality of individual input conductors for said circuit each inductively coupled to said loop; a current source; said input conductors being connected in series with said source; and control means for causing current from said source to be directed through one or more of said control conductors.

16. In a superconductor adder circuit; a carry circuit including a first superconductor gate conductor; a sum circuit including a second superconductor gate conductor; a first closed superconductor loop including a first control conductor arranged in magnetic field applying relationship to said first gate conductor; a second closed superconductor loop including a second control conductor arranged in magnetic field applying relationship to said second gate conductor; each of said gate conductors and said loops including said control conductors being maintained at a temperature at which it is superconductive; and first, second, and third input conductor means for said adder each inductively coupled to each of said loops so that currents in said input conductors produce additive currents in each of said loops.

17. In a superconductor adder circuit; a carry circuit including first and second superconductor paths; a sum circuit including third and fourth superconductor paths; first, second, third, and fourth closed superconductor loops including, respectively, first, second, third, and fourth control conductors arranged in magnetic field applying relationship to said first, second, third, and fourth superconductor paths; each of said paths and loops being maintained at a superconductive temperature; first, second, and third binary inputs for said circuit each including a binary one current path and a binary zero input current path; each of said binary one current paths being inductively coupled to said first and third loops; each of said binary zero input paths being inductively coupled to said second and fourth loops; and a single current source for supplying current to each of said input conductors and to said sum and carry circuits; said first path of said carry circuit being inductively coupled to said third loop and said second path of said carry circuit being inductively coupled to said fourth loop.

18. In a superconductor circuit including first and second superconductive paths connected in parallel circuit relationship with a current source; means for controlling the distribution of current from said source between said paths comprising a closed loop of superconductor material including a control conductor arranged in magnetic field applying relationship to one of said paths and a plurality of individual input conductors each connected in series with said current source and each inductively coupled to said loop.

19. In a superconductor circuit; a superconductor gate conductor maintained at a superconductive temperature; a superconductor control conductor arranged in magnetic field applying relationship to said gate conductor; and a plurality of individually operable input means each coupled to said control conductor and each effective when operated to produce in said control conductor a current which combines in said control conductor with current produced in said control conductor by any other of said input means which are then operated.

20. In a superconductor circuit, first and second superconductor paths connected in parallel with a current source and each maintained at a superconductive temperature; first and second control conductors arranged in magnetic field applying relationship to said first and second gate conductors, respectively, for controlling said gate conductors between superconductive and resistive states; and a plurality of input means coupled to said first and second control conductors and each operable to apply either a first or a second input to said circuit; each of said input means being effective, when operated to apply a first input to said circuit, to produce in said first control conductor a current which combines in said first control conductor with any current produced in said first control conductor by any other of said input means which are then operated to apply a first input to said circuit; each of said input means being effective, when operated to apply a second input to said circuit, to produce in said second control conductor a current which combines in said second control conductor with any current produced in said second control conductor by any other of said input means which are then operated to apply a second input to said circuit.

21. In a superconductor circuit; first and second superconductor gate conductors; first and second superconductor control conductors each arranged in magnetic field applying relationship to a corresponding one of said gate conductors; said first and second gate conductors being connected in a series circuit between a current input and a current output terminal; means maintaining said conductors at a superconductive operating temperature; each of said gate conductors having the same critical field at said operating temperature; each of said control conductors requiring the same minimum current to render it effective to drive the corresponding gate conductor resistive; and a superconductor path shunting said second control conductor; whereby when a predetermined current greater than said minimum current is applied to said current input terminal of said series circuit, said predetermined applied current flows through said first control conductor to render it effective to drive said first gate conductor resistive but only a portion of said predetermined applied current less than said minimum current flows through said second control conductor and said second gate conductor remains superconductive.

22. A binary full adder comprising a first superconductor circuit including first and second superconductor current paths connected in parallel with respect to a current source; a first superconductor gating device connected in said first path; a second superconductor gating device connected in said second path; first and second control conductors arranged in magnetic field applying relationship to said first and second superconductor gating devices; first, second, and third binary inputs for said circuit each including a binary one input conductor and a binary zero input conductor; means for applying a particular value of current to the binary zero input conductor for each input when that input is to apply a binary zero input to said adder and to the binary one input conductor when that input is to apply a binary one input to said adder; means connecting the binary one input conductors for each of said inputs to said first control conductor so that the current in said first control conductor equals the sum of the currents in the three binary one input conductors; and means connecting the binary zero input conductor for each of said inputs to said second control conductor so that the current in said second control conductor equals the sum of the currents in the three binary zero input conductors; each of said first and second superconductor gating devices being maintained at a temperature at which it is superconductive in the absence of a magnetic field; said first and second control conductors being respectively effective to drive said first and second gating devices resistive only when the current produced in the control conductor by the binary input conductors connected thereto is greater than said particular value of current; whereby, when the number of binary one inputs applied to said adder is either zero or one, current from said source is directed in said first superconductor circuit through said first path and, when the number of binary one inputs applied to said adder is either two or three, current from said source is directed in said first superconductor circuit through said second path.

23. A binary full adder comprising; a first superconductor circuit including first and second superconductor current paths connected in parallel with respect to a current source; a first superconductor gating device connected in said first path; a second superconductor gating device connected in said second path; first and second control conductors arranged in magnetic field applying relationship to said first and second superconductor gating devices, respectively; first, second, and third binary inputs for said circuit each including a binary one input conductor and a binary zero input conductor; means for applying a particular value of current to the binary zero input conductor for each input when that input is to apply a binary zero input to said adder and to the binary one input conductor when that input is to apply a binary one input to said adder; means connecting the binary one input conductors for each of said inputs to said first control conductor so that the current in said first control conductor equals the sum of the currents in the three binary one input conductors; means connecting the binary zero input conductor for each of said inputs to said second control conductor so that the current in said second control conductor is the sum of the currents in the three binary zero input conductors; each of said first and second superconductor gating devices being maintained at a temperature at which it is superconductive in the absence of a magnetic field; said first and second control conductors being respectively effective to drive said first and second gating devices resistive only when the current produced in the control conductor by the binary input conductors connected thereto is greater than said particular value of current; whereby, when the number of binary one inputs applied to said adder is either zero or one, current from said source is directed in said first superconductor circuit through said first path and, when the number of binary one inputs applied to said adder is either two or three, current from said source is directed in said first superconductor circuit through said second path; a second superconductor circuit including third and fourth superconductor gating devices connected in parallel with respect to a current source and each maintained at a temperature at which it is superconductive in the absence of a magnetic field; third and fourth control conductors arranged in magnetic field applying relationship to said third and fourth gating devices, respectively; said first, second, and third binary inputs being connected to said third and fourth control conductors for producing a current in said third control conductor for each binary input of one applied to said adder and a current in said fourth control conductor for each binary input of zero applied to said adder; said third and fourth control conductors being respectively connected to said first and second paths in said first circuit for producing a current in said third control conductor when the current in said first circuit is in said first path and a current in said fourth control conductor when the current in said first circuit is in said second path; said currents produced in said third and fourth control conductors by said binary inputs respectively combining with said currents produced in said third and fourth conductors by said current in said first circuit; whereby the combined current produced in said third control conductor is effective to drive said third gating device resistive when the number of binary one inputs applied to said circuit is either one or three and the combined current produced in said fourth control conductor is effective to drive said fourth gating device resistive when the number of binary one inputs applied to said circuit is either zero or two.

References Cited in the file of this patent

UNITED STATES PATENTS

| | | |
|---|---|---|
| 2,693,907 | Tootill | Nov. 9, 1954 |
| 2,949,602 | Crowe | Aug. 16, 1960 |

OTHER REFERENCES

Buck: "The Cryotron—A Superconductive Computer Element," Proceedings IRE, col. 44, No. 4, April 1956, p. 487 relied on.